(12) United States Patent
Geng et al.

(10) Patent No.: US 11,763,854 B2
(45) Date of Patent: Sep. 19, 2023

(54) SERVER

(71) Applicants: Inventec (Pudong) Technology Corporation, Shanghai (CN); INVENTEC CORPORATION, Taipei (TW)

(72) Inventors: Zhao Geng, Shanghai (CN); Guang-Zhao Tian, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 17/349,114

(22) Filed: Jun. 16, 2021

(65) Prior Publication Data

US 2022/0366939 A1  Nov. 17, 2022

(30) Foreign Application Priority Data

May 17, 2021 (CN) .......................... 202110535851.6

(51) Int. Cl.
| | | |
|---|---|---|
| H05K 7/00 | (2006.01) | |
| G11B 33/12 | (2006.01) | |
| H05K 7/20 | (2006.01) | |

(52) U.S. Cl.
CPC ....... G11B 33/128 (2013.01); H05K 7/20727 (2013.01)

(58) Field of Classification Search
None
See application file for complete search history.

(56) References Cited

U.S. PATENT DOCUMENTS

| | | | |
|---|---|---|---|
| 9,763,350 B2* | 9/2017 | Rust | H05K 7/1421 |
| 9,817,450 B2* | 11/2017 | Zani | G06F 1/185 |
| 10,317,957 B2* | 6/2019 | Adrian | H05K 7/1494 |
| 11,291,134 B2* | 3/2022 | Huang | G06F 1/181 |
| 2014/0340838 A1* | 11/2014 | Deng | H05K 7/1489 |
| | | | 248/346.03 |
| 2020/0103872 A1* | 4/2020 | Kuroda | G05B 19/4189 |

* cited by examiner

Primary Examiner — Anthony Q Edwards
Assistant Examiner — Rashen E Morrison
(74) Attorney, Agent, or Firm — Locke Lord LLP; Tim Tingkang Xia, Esq.

(57) ABSTRACT

This disclosure relates to a server including a storage chassis, a tray, a hard disk, a bracket, and a fan. The storage chassis includes a bottom plate and two sidewalls. The sidewalls respectively stand at two opposite sides of the bottom plate The bottom plate has a front edge and a rear edge that are opposite to each other and located between the sidewalls. The tray is slidably disposed on the storage chassis. The hard disk is disposed on the tray. The bracket is connected to the rear edge of the storage chassis. At least part of the bracket is located at a side of the rear edge of the storage chassis away from the front edge. The fan is disposed in the bracket, and the fan is electrically connected to the hard disk.

10 Claims, 5 Drawing Sheets

SERVER

CROSS-REFERENCE TO RELATED APPLICATIONS

This non-provisional application claims priority under 35 U.S.C. § 119(a) on Patent Application No(s). 202110535851.6 filed in China, P.R.C. on May 17, 2021, the entire contents of which are hereby incorporated by reference.

BACKGROUND OF THE INVENTION

Technical Field of the Invention

The present disclosure relates to a server, more particularly to a server that has a bracket located outside the rear side of a storage chassis.

Description of the Related Art

A server generally contains a certain number of hard disks to offer required services for a great number of users. Generally, the hard disks housed in the server cabinet are arranged in a compact manner in order to make the most of the internal space.

Conventionally, fans for cooling the hard disks are arranged at the rear side of the cabinet, and some additionally add fans in the chassis to further improve the heat dissipation. However, adding fan inside the cabinet occupies the space that is supposed for hard disk, reducing the number of hard disks the cabinet can afford.

SUMMARY OF THE INVENTION

The present disclosure provides a server whose fan barely occupies the internal space of a chassis thereof.

According to one aspect of the present disclosure, a server includes a storage chassis, a tray, a hard disk, a bracket, and a fan. The storage chassis includes a bottom plate and two sidewalls. The sidewalls respectively stand at two opposite sides of the bottom plate. The bottom plate has a front edge and a rear edge that are opposite to each other and located between the sidewalls. The tray is slidably disposed on the storage chassis. The hard disk is disposed on the tray. The bracket is connected to the rear edge of the storage chassis. At least part of the bracket is located at a side of the rear edge of the storage chassis away from the front edge. The fan is disposed in the bracket, and the fan is electrically connected to the hard disk.

According to the server discussed above, by arranging at least part of the bracket at a side of the rear edge of the storage chassis away from the front edge, the fans disposed in the bracket barely occupy the internal space of the storage chassis so that the fans do not occupy the space for the arrangement of the hard disks.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

Figure 1:
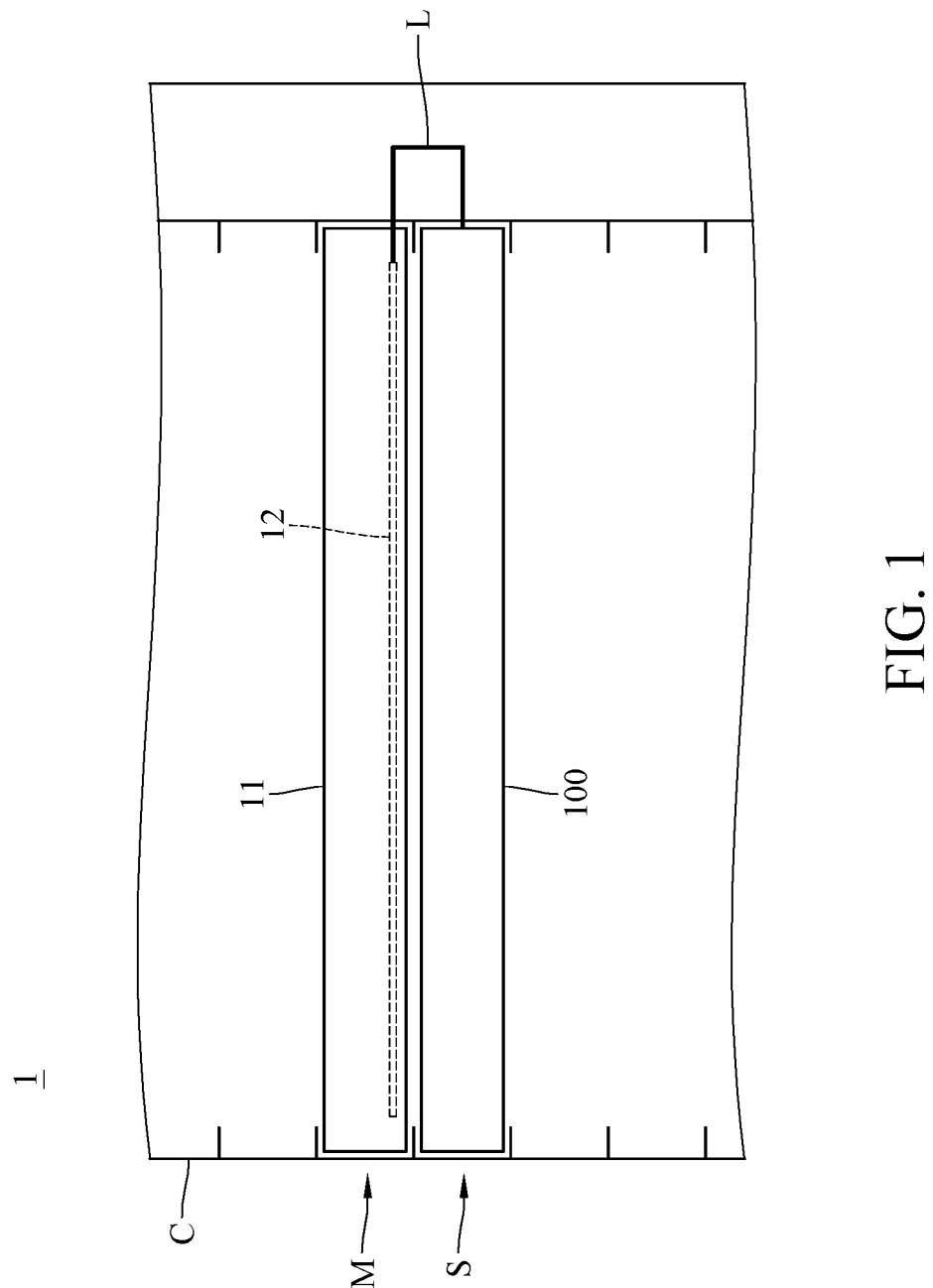
FIG. 1 is a simplified schematic view of a server according to one embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
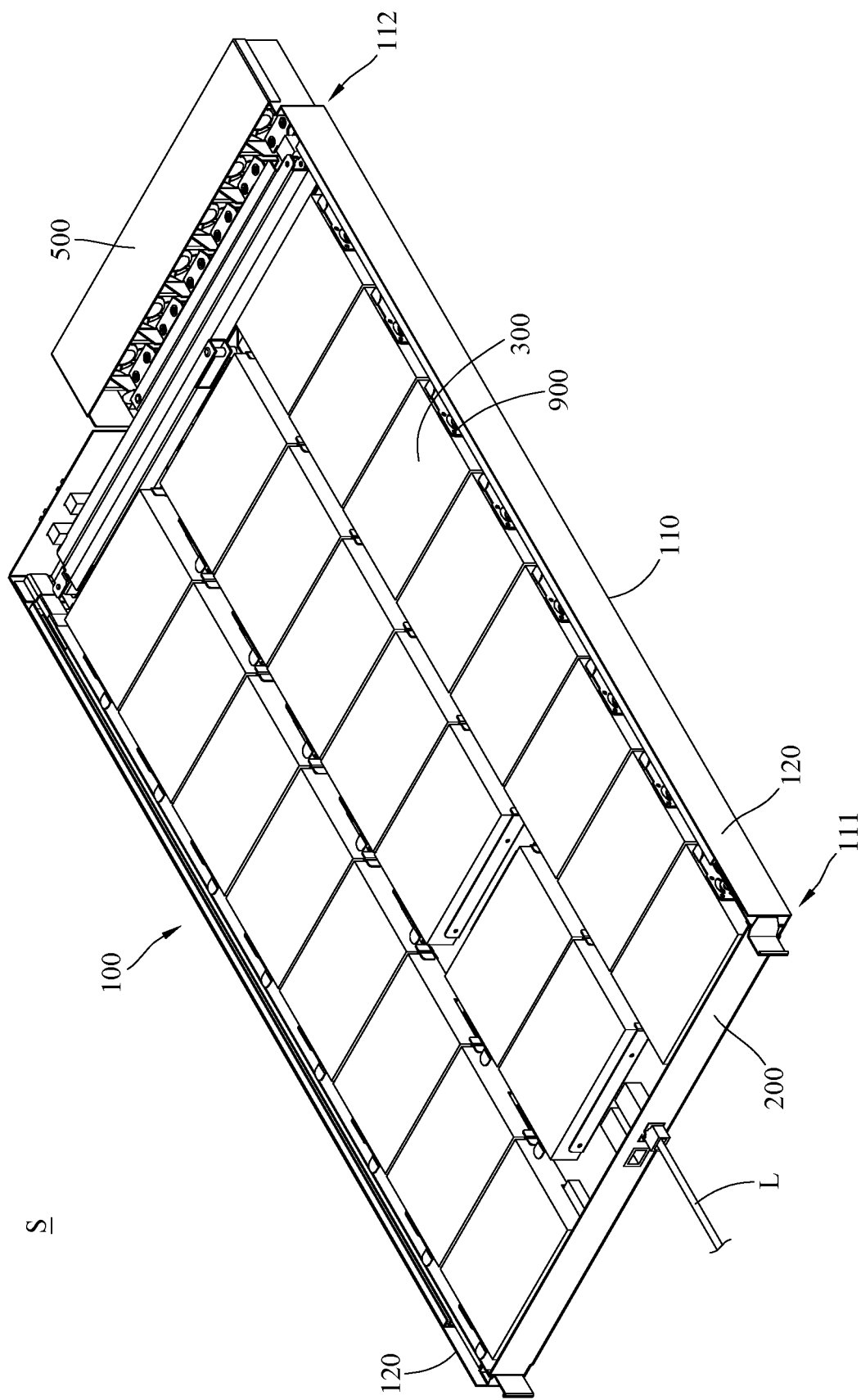
FIG. 2 is a perspective view of a storage layer of the server in FIG. 1.
Figure 3:
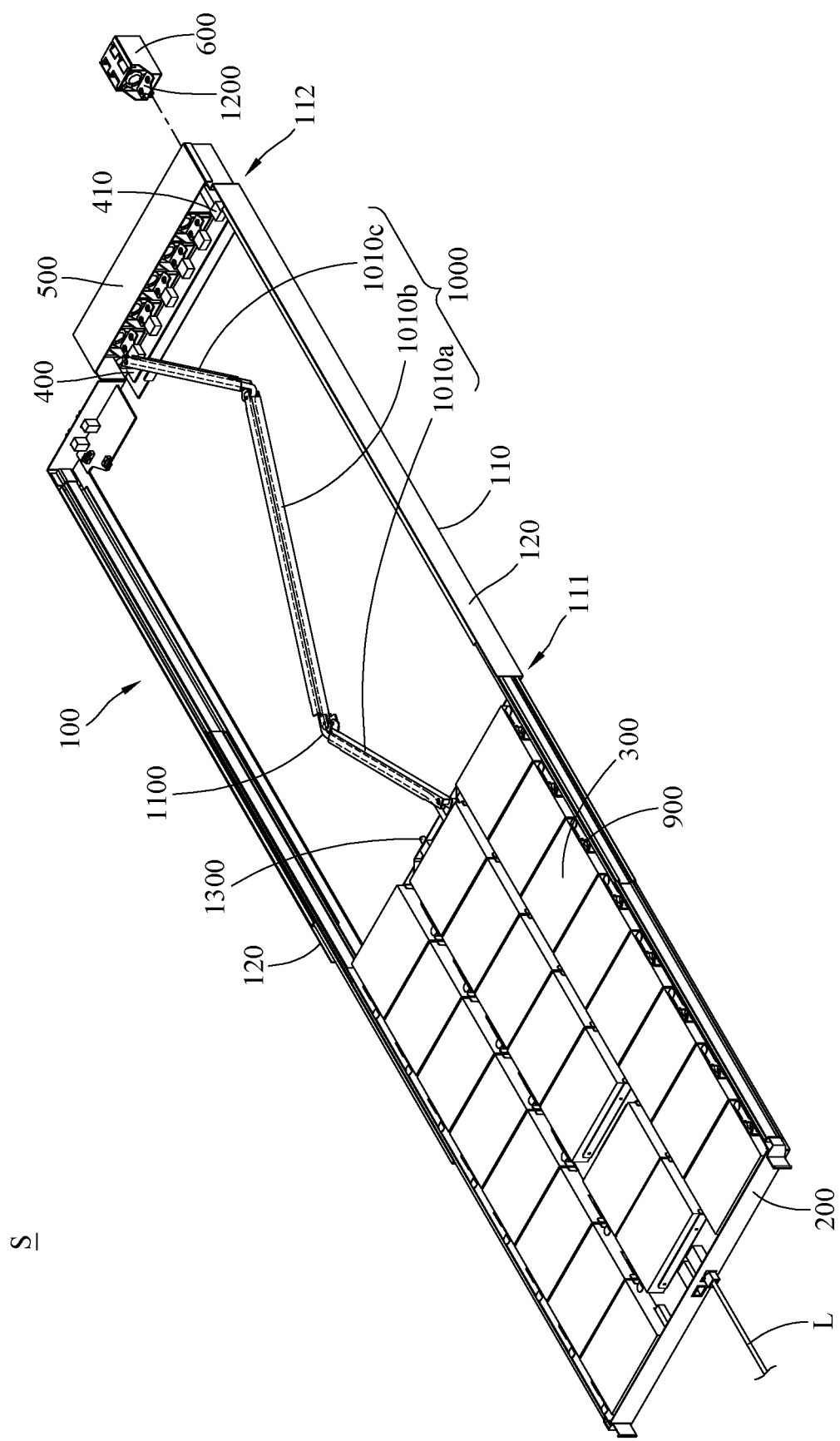
FIG. 3 is a perspective view showing a tray partially drawn out of the storage layer of the server in FIG. 2.
Figure 4:
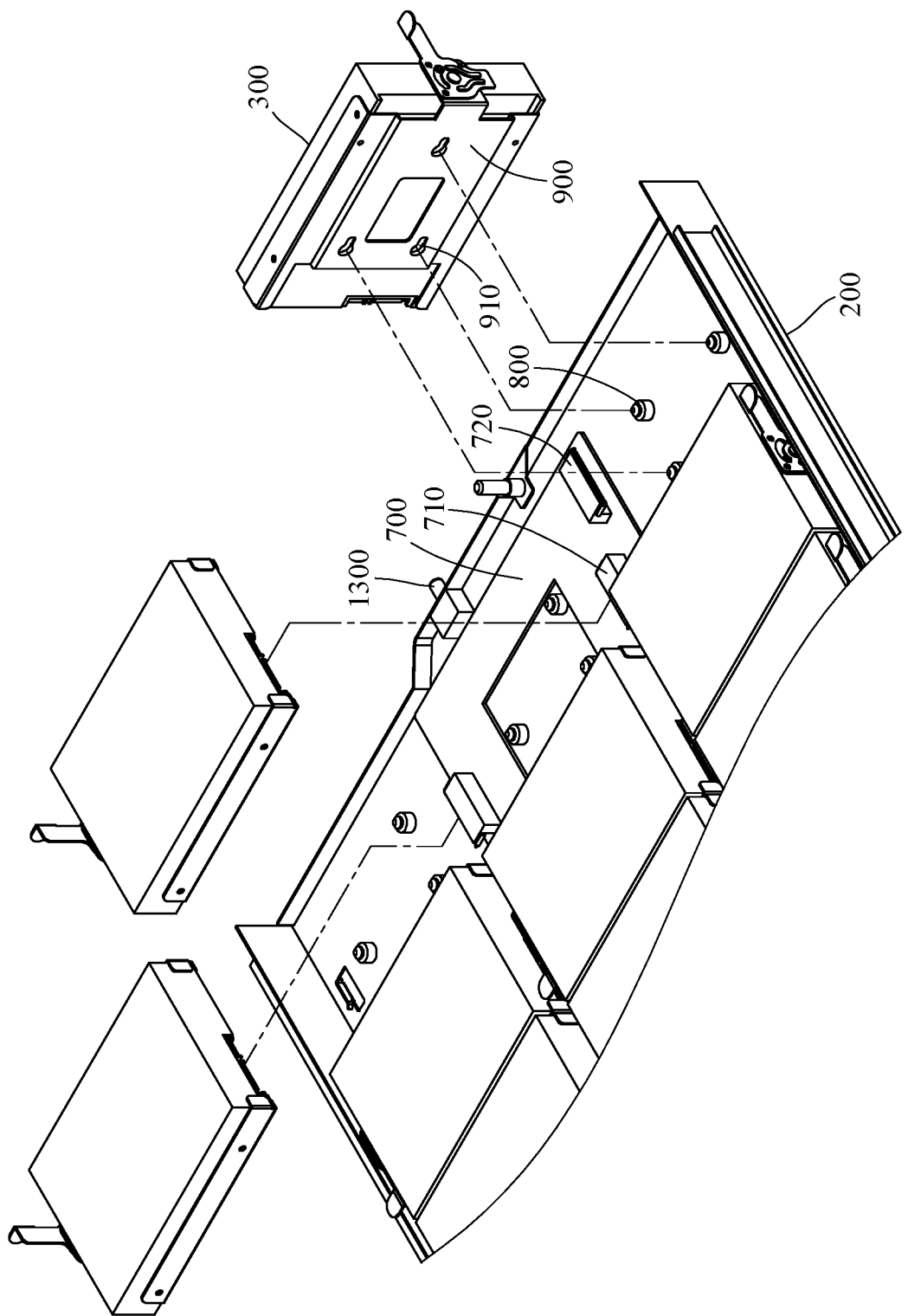
FIG. 4 is a partially exploded and enlarged view of the storage layer in FIG. 2.
Figure 5:
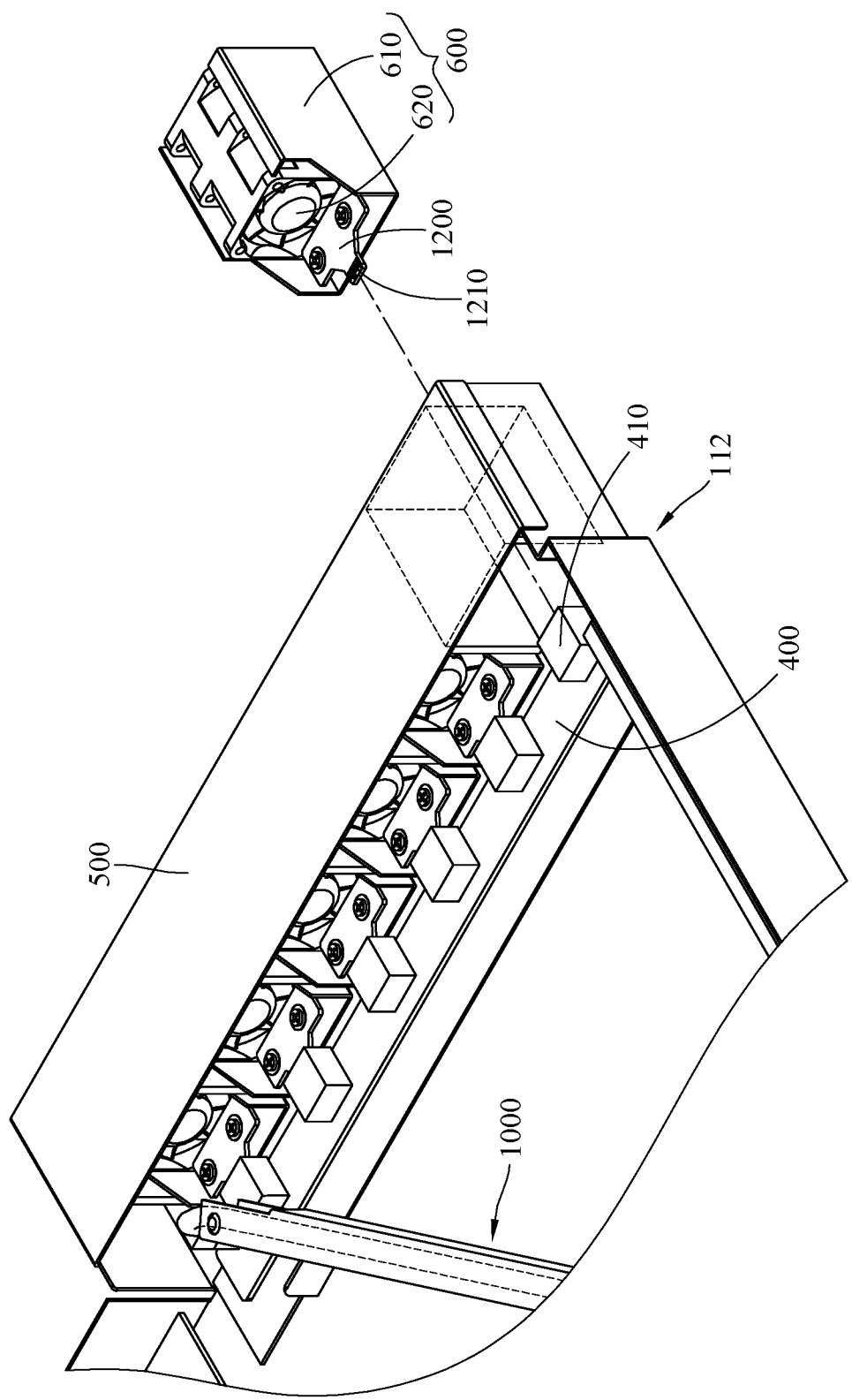
FIG. 5 is a partially exploded and enlarged view of the storage layer in FIG. 3.

Please refer to FIG. 1 to FIG. 4, where FIG. 1 is a simplified schematic view of a server 1 according to one embodiment of the present disclosure, FIG. 2 is a perspective view of a storage layer S of the server 1 in FIG. 1, FIG. 3 is a perspective view showing a tray 200 partially drawn out of the storage layer S of the server 1 in FIG. 2, FIG. 4 is a partially exploded and enlarged view of the storage layer S in FIG. 2, and FIG. 5 is a partially exploded and enlarged view of the storage layer S in FIG. 3.

In this and some embodiments of the present disclosure, the server 1 includes a storage layer S. Also, the server 1 may further include a cabinet C and a host layer M. The host layer M is located in the cabinet C. The host layer M includes a host chassis 11 and a mainboard 12. The host chassis 11 is disposed in the cabinet C. The mainboard 12 is disposed on the host chassis 11. The storage layer S is located in the cabinet C and arranged below the host layer M. The storage layer S includes a storage chassis 100, the tray 200, a plurality of hard disks 300, a circuit board 400, a bracket 500, and a plurality of fans 600. The storage chassis 100 is disposed in the cabinet C.

In this embodiment, the storage chassis 100 includes a bottom plate 110 and two sidewalls 120. The sidewalls 120 respectively stand at two opposite sides of the bottom plate 110. The bottom plate 110 has a front edge 111 and a rear edge 112 that are opposite to each other and located between the sidewalls 120. The tray 200 is slidably disposed on the storage chassis 100 so that at least part of the tray 200 can be drawn out of the cabinet C.

In this embodiment, the hard disks 300 are disposed on the tray 200. In detail, in this and some embodiments of the present disclosure, the storage layer S of the server 1 may further include a backplane 700, a plurality of protrusions 800, and a plurality of holders 900. The backplane 700 is fixed on the tray 200. The backplane 700 has a plurality of first connectors 710 and a plurality of second connectors 720. In this and some embodiments of the present disclosure, there are seven first connectors 710, and there are sixteen second connectors 720. The second connectors 720 are located at two opposite sides of the first connectors 710. The protrusions 800 are disposed on the tray 200 and located at two opposite sides of the backplane 700. In this and some embodiments of the present disclosure, there are sixteen holders 900. Each holder 900 has a plurality of holes 910. The holders 900 are engaged with the backplane 700 by inserting the protrusions 800 into the holes 910. In this and some embodiments of the present disclosure, there are twenty-three hard disks 300. In the storage chassis 100, the hard disks 300 are arranged in plural lines, and the hard disks 300 of each line are closely arranged with each other so as to form a bunch of disks (i.e., JBOD, just a bunch of disks). In addition, the hard disks 300 can be divided into two groups, one group contains seven hard disks 300, and the other group contains sixteen hard disks 300. The hard disks 300 of the first group are directly disposed on the first connectors 710 so as to be electrically connected to the backplane 700. The hard disks 300 of the second group are disposed on the holders 900, and the holders 900 can be fixed to the tray 200 by being moved in the specific direction to make the protrusions 800 engage with the holes 910. By doing so, the hard disks 300 of the second group are installed in position on the tray 200, and are electrically connected to the backplane 700 via the second connectors 720.

In this and some embodiments of the present disclosure, the mainboard 12 is electrically connected to the hard disks 300 via cables L that are disposed through the front edge 111 of the storage chassis 100. The circuit board 400 is disposed on the storage chassis 100. As shown in FIG. 3, the circuit board 400 is located closer to the rear edge 112 than the front edge 111. The circuit board 400 is electrically connected to the hard disks 300. In detail, the storage layer S may further include a cable holder 1000 and a cable 1100. The cable holder 1000 includes a first sub cable holder 1010a, a second sub cable holder 1010b, and a third sub cable holder 1010c. The first sub cable holder 1010a is pivotably disposed on the tray 200. The second sub cable holder 1010b is pivotably connected to and located between the first sub cable holder 1010a and the third sub cable holder 1010c. The third sub cable holder 1010c is pivotably disposed on the storage chassis 100. Moving the tray 200 can force the first sub cable holder 1010a, the second sub cable holder 1010b, and the third sub cable holder 1010c to pivot with respect to one another, thus, the cable holder 1000 can be folded or unfolded by operating the tray 200. The cable 1100 is arranged along the cable holder 1000 and connected to the backplane 700 and the circuit board 400. The hard disks 300 are electrically connected to the circuit board 400 via the cable 1100. The cable holder 1000 helps prevent the cable 1100 from being stretched when the tray 200 is sliding, preventing from affecting the electrical connection between the hard disks 300 and the circuit board 400. The circuit board 400 is located between at least part of the cable holder 1000 and the bottom plate 110, thus when the cable holder 1000 is folded, the cable holder 1000 is received in the space above the circuit board 400 without occupying the space for the hard disks 300.

In this embodiment, the bracket 500 is arranged at the rear edge 112 of the storage chassis 100. As shown in FIG. 3 and FIG. 5, at least part of the bracket 500 is located at a side of the rear edge 112 of the storage chassis 100 away from the front edge 111; that is, the bracket 500 is arranged outside the rear edge 112 of the storage chassis 100. The fans 600 are disposed in the bracket 500. In such an arrangement, the fans 600 barely occupy the internal space of the storage chassis 100 so that the fans 600 do not occupy the space for the arrangement of the hard disks 300. As discussed, in this and some embodiments of the present disclosure, the mainboard 12 and the hard disks 300 being arranged in different layers of the cabinet C prevents the mainboard 12 from occupying the space of the storage chassis 100 that is served for accommodating the hard disks 300; however, the location of the host layer M is exemplary and may be changed as required. For example, in some other embodiments, the host layer and the storage layer may be located in different cabinets.

In this embodiment, the fans 600 are electrically connected to the hard disks 300. In detail, in this and some embodiments of the present disclosure, each fan 600 includes a casing 610 and an impeller 620, where the casing 610 is disposed in the bracket 500, and the impeller 620 is disposed in the casing 610. The storage layer S may further include an adapter board 1200 connected to and located between the casings 610 and the circuit board 400. The adapter board 1200 is substantially in parallel with the direction of the airflow generated by the impellers 620, thus the airflow will not be blocked by the adapter board 1200. The adapter board 1200 has a plurality of connection terminals 1210 (e.g., gold fingers). The circuit board 400 has a plurality of slot connectors 410. The connection terminals 1210 are inserted into the slot connectors 410. The insertion direction of the connection terminals 1210 is substantially parallel to the direction of the airflow generated by the impellers 620, thus the airflow will not be blocked. The impellers 620 of the fans 600 are electrically connected to the circuit board 400 and the hard disks 300 by connecting the connection terminals 1210 of the adapter board 1200 to the slot connectors 410 of the circuit board 400. Note that the rotation speed of the impellers 620 is adjusted according to the speed of the hard disks 300 in order to provide a sufficient heat dissipation to control the operating temperature of the hard disks 300.

In this and some embodiments of the present disclosure, the storage layer S may further include a switch 1300 disposed on the tray 200. The switch 1300 is electrically connected to the hard disks 300 via the backplane 700. The switch 1300 can be activated as it reaches a specific position along with the tray 200. In detail, when the tray 200 is moved outward with respect to the storage chassis 100, the switch 1300 is spaced apart from and not in contact with the storage chassis 100; on the other hand, when the tray 200 is fully closed, the switch 1300 is moved to a position that is pressed and activated by the storage chassis 100. In addition, when the switch 1300 is not activated, meaning that the hard disks 300 are located relatively away from the fans 600, thus the circuit board 400 may raise the rotation speed of the hard disks 300 during the off-time of the switch 1300 so as to compensate the longer distance between the hard disks 300 and the fans 600.

According to the server discussed above, by arranging at least part of the bracket at a side of the rear edge of the storage chassis away from the front edge, the fans disposed in the bracket barely occupy the internal space of the storage chassis so that the fans do not occupy the space for the arrangement of the hard disks.

In some embodiments, the server may further include an adapter board connected to and located between the casing and the circuit board. The adapter board is substantially in parallel with the direction of the airflow generated by the impellers, thus the airflow will not be blocked by the adapter board.

In some embodiments, the adapter board has a plurality of connection terminals, and the circuit board has a plurality of slot connectors. The connection terminals are inserted into the slot connectors, and the insertion direction of the connection terminals is substantially parallel to the direction of the airflow generated by the impellers, thus the airflow will not be blocked.

In some embodiments, the rotation speed of the impellers is adjusted according to the speed of the hard disks or the activation of the switch in order to provide a sufficient heat dissipation to control the operating temperature of the hard disks.

The embodiments are chosen and described in order to best explain the principles of the present disclosure and its practical applications, to thereby enable others skilled in the art best utilize the present disclosure and various embodiments with various modifications as are suited to the particular use being contemplated. It is intended that the scope of the present disclosure is defined by the following claims and their equivalents.

What is claimed is:

1. A server, comprising:
a storage chassis, comprising a bottom plate and two sidewalls, wherein the sidewalls respectively stand at two opposite sides of the bottom plate, and the bottom plate has a front edge and a rear edge that are opposite to each other and located between the sidewalls;
a tray, slidably disposed on the storage chassis;
a hard disk, disposed on the tray;
a bracket, connected to the rear edge of the storage chassis, wherein a geometric center of the bracket is located at a side of the rear edge of the storage chassis away from the front edge, a connection edge of the bracket connected to the rear edge of the storage chassis is located between the geometric center of the bracket and the front edge of the storage chassis, and the bracket is served as an overhang at the rear edge of the storage chassis; and
a fan, disposed in the bracket, wherein the fan is electrically connected to the hard disk.

2. The server according to claim 1, further comprising a cabinet, a host chassis, a mainboard, and a circuit board, wherein the host chassis and the storage chassis are disposed in the cabinet, the mainboard is disposed on the host chassis, the mainboard is electrically connected to the hard disk, the circuit board is disposed on the storage chassis, the circuit board is located closer to the rear edge than the front edge, and the circuit board is electrically connected to the hard disk and the fan.

3. The server according to claim 2, further comprising a cable holder and a cable, wherein the cable holder comprises a plurality of sub cable holders that are sequentially connected, adjacent two of the plurality of sub cable holders are pivotably connected to each other, the plurality of sub cable holders are pivotably disposed on the tray and the storage chassis, the plurality of sub cable holders are pivoted by sliding the tray, the cable holder is folded or unfolded by pivoting the plurality of sub cable holders, the cable is arranged along the cable holder, the hard disk is electrically connected to the circuit board via the cable, and the circuit board is located between at least part of the cable holder and the bottom plate.

4. The server according to claim 2, further comprising an adapter board, wherein the fan comprises a casing and an impeller, the casing is disposed in the bracket, the impeller is disposed in the casing, the adapter board is connected to and located between the casing and the circuit board, the adapter board is substantially in parallel with a direction of an airflow generated by the impeller, and the impeller is electrically connected to the circuit board via the adapter board.

5. The server according to claim 4, wherein the adapter board has a plurality of connection terminals, the circuit board has a plurality of slot connectors, the plurality of connection terminals are inserted into the plurality of slot connectors, an insertion direction of the plurality of connection terminals is substantially parallel to the direction of the airflow generated by the impeller, and the impeller is electrically connected to the circuit board via the plurality of connection terminals of the adapter board.

6. The server according to claim 5, wherein the plurality of connection terminals are gold fingers.

7. The server according to claim 1, further comprising a switch disposed on the tray, wherein the switch is electrically connected to the hard disk, and the switch is pressed by or spaced apart from the storage chassis by sliding the tray with respect to the storage chassis.

8. The server according to claim 1, further comprising a backplane and a holder, wherein the backplane and the holder are disposed on the tray, the hard disk is disposed on the holder, and the hard disk is electrically connected to the backplane.

9. The server according to claim 8, further comprising a protrusion disposed on the tray, wherein the holder has a hole, and the holder is engaged with the backplane by inserting the protrusion into the hole.

10. The server according to claim 1, wherein a quantity of the hard disk is twenty-three, and the hard disks form a bunch of disks.

* * * * *